United States Patent
Grotenhuis

[19]

[11] Patent Number: 6,126,452
[45] Date of Patent: Oct. 3, 2000

[54] VIDEO CARD

[75] Inventor: Robert-Jan Grotenhuis, 's-Hertogenbosch, Netherlands

[73] Assignee: Tulips Computers International B.V., Netherlands

[21] Appl. No.: 08/964,310

[22] Filed: Nov. 4, 1997

[30]   Foreign Application Priority Data

Nov. 5, 1996 [NL] Netherlands ............................ 1004429

[51] Int. Cl.[7] ................................................. H01R 12/00
[52] U.S. Cl. ................................................. 439/61; 439/55
[58] Field of Search ................................. 439/55, 61, 217, 439/218; 361/748

[56]   References Cited

U.S. PATENT DOCUMENTS

| | | | |
|---|---|---|---|
| 4,573,753 | 3/1986 | Vogl | 339/17 |
| 4,647,123 | 3/1987 | Chin et al. | 339/17 |
| 5,470,240 | 11/1995 | Suzuki | 439/157 |

FOREIGN PATENT DOCUMENTS 0 117 954  9/1984  European Pat. Off. .

OTHER PUBLICATIONS

IBM Technical Disclosure Bulletin, "Convertible Card for Multiple Bus Architectures", vol. 36, No. 2, Feb. 1993, 3 pages.

IBM Technical Disclosure Bulletin, "Enabling/Disabling Video Bus for Industrial Systems", vol. 36, No. 12, May 1991, 3 pages.

*Primary Examiner*—Lincoln Donovan
*Assistant Examiner*—Chandrika Prasad
*Attorney, Agent, or Firm*—Michaelson & Wallace; Peter L. Michaelson

[57]   ABSTRACT

Disclosed is a video card (120) which comprises a substantially rectangular, sheetlike component support(29) with a lower edge (21) and a rear edge (22). The video card (120) has a first edge connector (25) formed as a projecting portion (23) starting from the lower edge (21) of the component support (29), which projecting portion (23) is provided with terminals (24). The video card (120) further has a sub-D connector (26) provided with terminals (28), arranged at the rear edge (22) of the component support (29). According to the present invention, the video card (120) further has a second edge connector (130) formed as a projecting portion (131) starting from the lower edge (21) of the component support (29), which projecting portion (131) is provided with terminals (132), and the terminals (28) of the sub-D connector (26) are coupled to terminals (132) of the second edge connector (130).

7 Claims, 2 Drawing Sheets

VIDEO CARD

FIELD OF THE INVENTION

This invention relates to a video card, for instance for use in a Personal Computer (PC).

BACKGROUND OF THE INVENTION

As is well known, the various electronic circuits of a computer are arranged on printed circuit boards, which are also referred to as "card". In principle, all parts and circuits could be arranged on a single card, but that is not practical. In practice, often use is made of a construction whereby a card designated by the term of "motherboard" is provided with a multiplicity of plug-in connectors, into which the edge connectors of other, specific function cards can be plugged to connect those function cards with the motherboard. An example of such a specific function card is the video card, on which the circuits are accommodated which, succinctly stated, provide the signals to be supplied to a monitor that are required for displaying an image on the monitor.

An advantage of such a construction is that such specific function cards can be individually developed by specialized companies. In case of a defect, a function card can be simply replaced, and it is also possible to replace a function card with a later version if it is desired to improve the performance of the computer.

To be able to profit from these advantages, it is necessary that different types of motherboards and different types of function cards be mutually compatible. This means, among other things, that the dimensions of the connector attached to the motherboard is compatible with the connector attached to the specific function card, and that the corresponding pins in the connector terminals always carry the same signals. Further, the shape of the function cards should be configured such that they "fit" in a standard housing, and further the points of attachment should correspond between the mating connections.

To achieve such compatibility, various manufacturers of motherboards and function cards have made mutual agreements laid down in "standards".

There are presently multiple standards that apply to motherboards and function cards, as well as to the connectors associated therewith. An example of a standard for a motherboard is ATX version 1.0, and an example of a standard for a video card is AGP version 1.0. These designations are known to those skilled in the present art.

For the motherboard, a new standard is presently being developed, which is designated "NLX". The standard NLX, at least as regards the mechanical specifications, is not compatible with the standard ATX. The differences are such that the current AGP video cards are not usable in combination with the new NLX motherboards.

Consequently, there is a need for a new video card which satisfies the AGP standard and which is useful in combination with the new NLX motherboards.

Of course, it would be possible to develop a new video card which is useful solely in combination with the new NLX motherboards, but which is not useful in combination with the motherboards according to the ATX standard. A disadvantage of such an approach, however, is that a producer of AGP video cards must manufacture two types, viz. a first type usable in combination with the motherboards according to the ATX standard and a second type usable in combination with the motherboards according to the NLX standard.

A feature of one embodiment of the invention is to provide an AGP video card which is useful both in combination with NLX motherboards and in combination with ATX motherboards.

Another embodiment of the invention relates to an NLX motherboard adapted to the AGP video card.

BRIEF DESCRIPTION OF THE DRAWINGS

The aspects mentioned and other aspects, features and advantages of the present invention will be clarified by the following description of a preferred embodiment of a video card according to the invention, with reference to the drawing, in which equal reference numerals designate equal or comparable parts, and in which.

DETAILED DESCRIPTION OF THE PRESENT INVENTION

The terms "AGP", "ATX", "sub-D" and "NLX", as used herein, all refer to well known corresponding standards in the art and in effect as of the filing date of this application.

Figure 1:
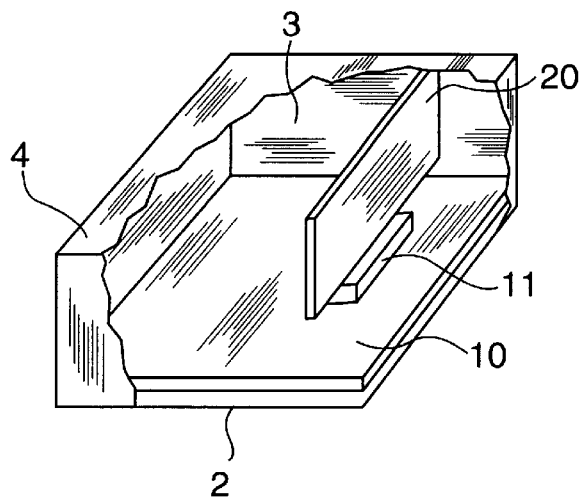
FIG. 1 depicts a perspective view of a computer casing, with several side thereof partly cutaway.

FIG. 1 schematically shows a perspective view of a substantially rectangular casing 1. The casing 1 has inter alia a bottom 2, a rear wall 3, and a top wall 4. Adjacent to the bottom 2 a motherboard 10 is disposed, parallel to the bottom 2. Fitted on the motherboard 10 is a video card 20, this video card 20 being directed substantially at right angles to the motherboard 10 and also substantially at right angles to the rear wall 3 of the casing 1. Such a casing 1 with a motherboard 10 and a video card 20 fitted therein is generally known.

Figure 2:
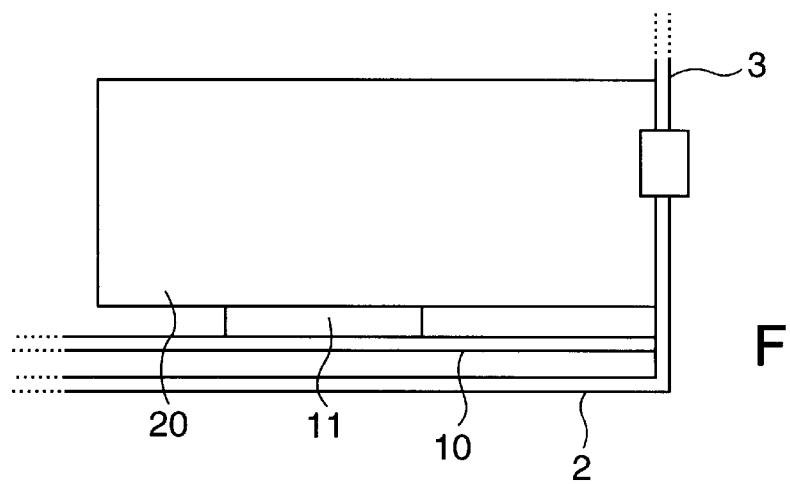
FIG. 2 depicts a side elevation of a motherboard with a video card.
Figure 3:
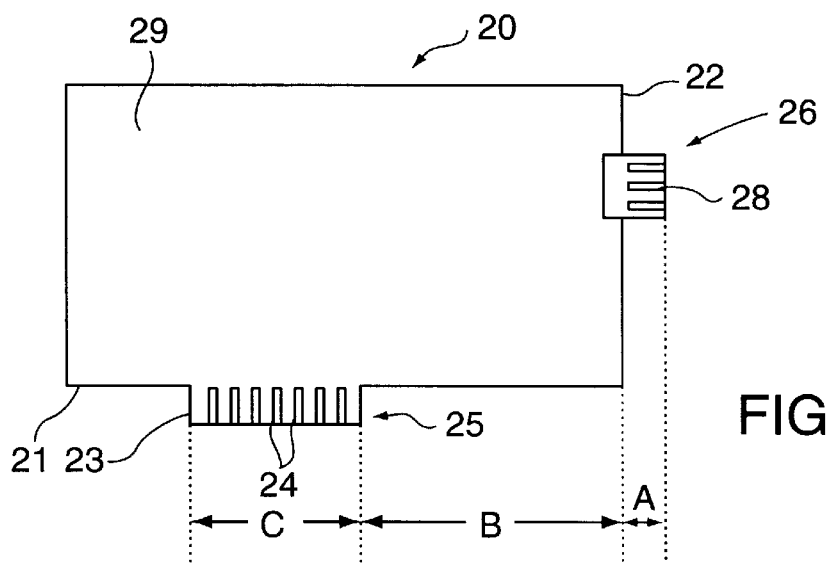
FIG. 3 depicts a side elevation of the video card in mounted position.

FIG. 2 shows schematically, and not to scale, a side elevation of the motherboard 10 and the video card 20, as well as part of the bottom 2 and the rear wall 3 of the casing 1. FIG. 3 diagrammatically shows a view of the surface of the video card 20. As is clearly represented in FIG. 3, the video card 20 comprises a sheetlike component support 29 of a substantially rectangular shape, with a lower edge 21 and a rear edge 22. At the lower edge 21 the component support 29 has a projecting portion 23 on which terminals 24 are provided, of which only a few are represented in the drawing. The projecting portion 23 with the terminals 24 forms a first edge connector 25 which fits in a plug-in connector 11 provided on the motherboard 10. The motherboard 10 and the video card 20 can communicate with each other via the connectors 11 and 25, the functions of the individual terminals 24 are typically fabricated to satisfy established standards.

For communication with a monitor to be controlled, which for simplicity is not shown in the drawings, the video card 20 is provided with a monitor connector, mounted adjacent the rear edge 22 of the component support 29, for instance a standard sub-D connector 26, whose terminals are designated by the reference numeral 28. In mounted condition of the video card 20 the connector 26 reaches through the rear wall 3 of the casing 1, so that a user can connect a monitor cable to it.

The video card configuration depicted in FIGS. 2 and 3 concerns a satisfies both the AGP standard for the video card 20 and on the other the ATX standard for the motherboard 10.

The accelerated graphic port (AGP) standard for the video card includes, among many other things, mechanical definitions and dimensions relative to inter alia the dimensions of the component support 29 and the asociated connectors. More particularly, the AGP standard prescribes the length C of the first edge connector 25. The projecting length A of the sub-D connector 26 is normally about 20 mm.

As mentioned, there are several types of video cards, and ATX motherboards exist that do not support the AGP standard. For ATX motherboards that do support the AGP standard, there is a requirement specifying the positioning of the plug-in connector 11 (for receiving the first edge connector 25 of the AGP video card 20) in the motherboard 10. More particularly, this requirement concerns the distance between the rear wall 3 and the plug-in connector 11. This means, in turn, that with an AGP video card that is compatible with the ATX standard for the motherboard, the distance B between the rear edge 22 and the first edge connector 25 is fixed. According to AGP specification version 1.0, this distance B is 65.69 mm.

A drawback of this ATX standard is that taking the motherboard 10 from the casing requires a fairly complex procedure, whereby first the connector 26 must be detached from the rear wall 3, whereupon the video card 20 is then detached from the motherboard 10 and removed, and finally the motherboard is removed from the casing. One of the objectives of the new standard NLX is to provide a construction whereby the motherboard can be taken out in a simpler manner, viz. with video card and all. This means that there is no physical connection anymore between the rear edge of the video card and the rear wall 3 of the casing 1.

Further, the new NLX standard allows for the possibility that at the rear wall 3 of the casing 1 two standard I/O connectors are arranged, stacked onto each other, to which end space is to be left clear between the rear edge of the video card and the rear wall 3 of the casing 1.

Figure 4:
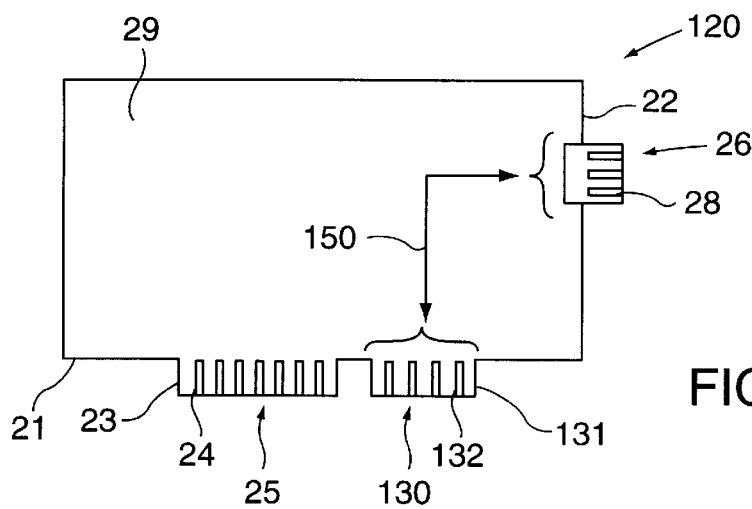
FIG. 4 depicts a side elevation similar to FIG. 3, of a video card according to one embodiment of the present invention.

FIG. 4 shows an elevation similar to FIG. 3, of an AGP video card 120 according to the present invention. The AGP video card 120, as does the known video card 20 in FIG. 3, comprises a substantially rectangular sheetlike component support 29 with a first edge connector 25 arranged at the lower edge 21 and a sub-D connector 26 arranged at the rear edge 22, with the above parameters A, B and C having remained the same. In addition, the AGP video card 120 is provided with a second edge connector 130 arranged next to the first edge connector 25. The second edge connector 130, similarly to the first edge connector 25, is formed as a projecting portion 131 of the lower edge 21 of the component support 29, provided with terminals 132. The terminals 132 of the second edge connector 130 are coupled, as symbolized by line 150, to respective terminals 28 of the sub-D connector 26, so that the functions of the terminals 28 of the sub-D connector 26 are also available at terminals 132 of the second edge connector 130.

The second edge connector 130 could be arranged on the side of the first edge connector 25 remote from the rear edge 22, that is, in FIG. 4 on the left-hand side of the first edge connector 25. Preferably, however, the second edge connector 130 is arranged between the rear edge 22 and the first edge connector 25, as depicted.

Figure 5:
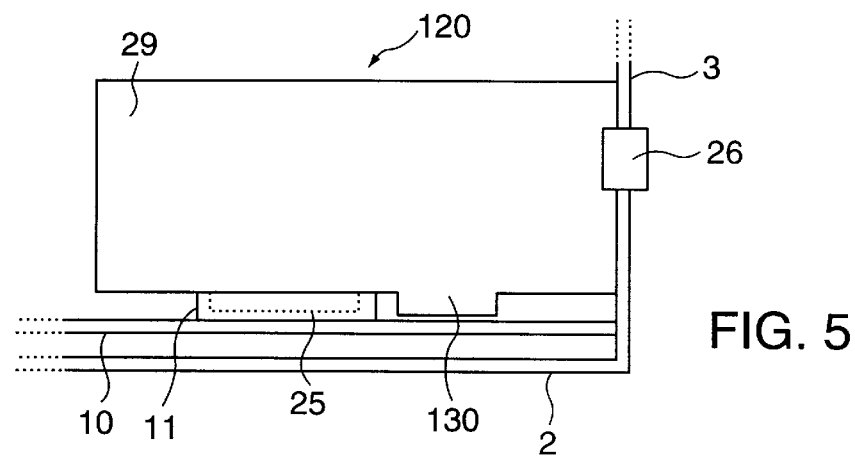
FIG. 5 depicts a side elevation similar to FIG. 2, of the video card according to embodiment of the present invention, used in combination with an ATX motherboard.

FIG. 5 shows an elevation similar to FIG. 2, of the AGP video card 120 according to the present invention, used in combination with an ATX motherboard 10. The first edge connector 25 (indicated in dots) is inserted in the plug-in connector 11 of the ATX motherboard 10. The second edge connector 130 is not connected now and is disposed, unused, to the side of the plug-in connector 11 of the ATX motherboard 10. Signals for the monitor are derived from the sub-D connector 26. It will thus be clear that the AGP video card 120 proposed according to the present invention is still usable in combination with an ATX motherboard 10. In the FIG. 5 embodiment used in conjunction with ATX motherboards, however, on the motherboard 10 no large parts may be arranged between the rear wall 3 and the plug-in connector 11 on the motherboard that the second edge connector 130 of the motherboard.

Figure 6:
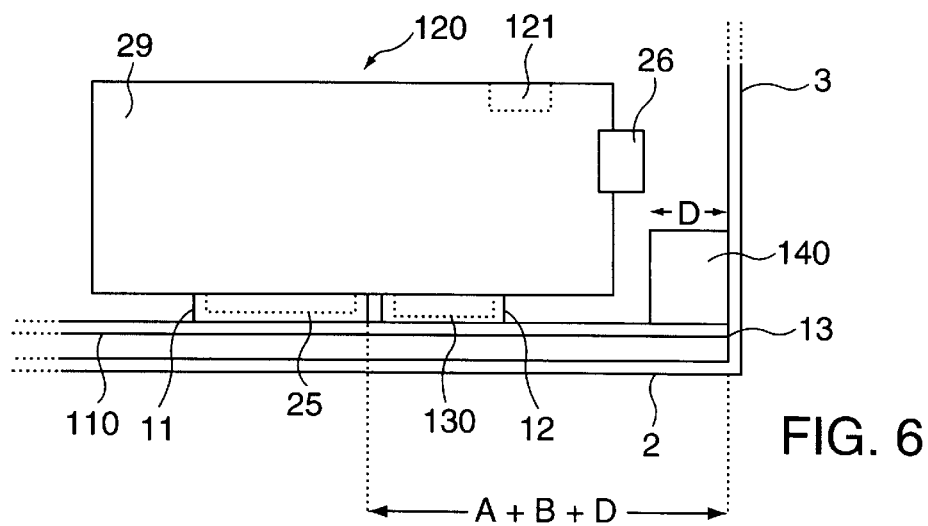
FIG. 6 depicts a side elevation similar to FIG. 2, of the video card according to the present invention, used in combination with an NLX motherboard.

FIG. 6 shows an elevation similar to FIG. 2, of the AGP video card 120 according to the present invention, used in combination with an NLX motherboard 110 according to the present invention. The AGP video card 120 has been displaced relative to the rear wall 3 in the direction of the front wall (not shown) of the casing 1, that is, to the left in the drawing, over a distance which can be written as A+D, with D being the expected measurement, measured perpendicularly to the rear wall 3, of an I/O connector 140, if present, or a stack of two I/O connectors 140, if present. To that end, the position of the plug-in connector 11 on the NLX motherboard 110 has been displaced over the above-mentioned distance A+D relative to the position of the plug-in connector 11 on the ATX motherboard. More particularly, the distance between the plug-in connector 11 and the rear edge 13 of the NLX motherboard 110 is at least equal to A+B+D. According to the present AGP standard, B is 65.69 mm, and to allow for a range of possible connectors 140, the measurement D for the space to be left clear, as prescribed in the NLX specification version 0.81, is 23.19 mm.

The sub-D connector 26 of the AGP video card 120 is not connected now, and is disposed unused in the space between the rear edge 22 and the rear wall 3. Signals for the monitor are transmitted via the second edge connector 130 (indicated in dots) to the NLX motherboard 110, which to that end is provided with a second plug-in connector 12 next to the first-mentioned plug-in connector 11. Any one of the I/O connectors 140 can serve for connecting a monitor cable.

It will thus be clear that the AGP video card 120 proposed according to the present invention is also usable in combination with an NLX motherboard 110. The AGP standard, however, must allow for the fact that the maximum allowable length of the video card 120 as measured along the lower edge 21 is reduced by the amount A+D. Normally, the maximum allowable length of the video card is defined by the corresponding dimension of the casing 1, and is designated as "full-length ISA". In practice, that maximum allowable length is amply sufficient, and the current video cards all have a length less than the maximum allowable length mentioned, so that the reduction of that maximum allowable length by the amount of A+D is not a practical drawback.

Thus the present invention provides a video card which is usable both in combination with ATX motherboards and in combination with NLX motherboards. Further, in combination with NLX motherboards an advantage is gained in that the routing and shielding of the monitor connector takes place on the motherboard, so that a better EMC behavior is achieved.

It will be clear to those skilled in the art that the scope of protection of the present invention as defined by the claims is not limited to the embodiments discussed and represented in the drawings, but that within the framework of the inventive concept changes or modifications are possible.

Thus, it is possible, for instance, to replace the combination of the first plug-in connector 11 and the second plug-in connector 12 on the NLX motherboard 110 by a single plug-in connector the length of which has been chosen to be of such magnitude that it is capable of receiving both the first edge connector 25 and the second edge connector 130. It is also possible that the second edge connector 130 is replaced with several edge connectors jointly fulfilling the function of the second edge connector 130.

It is also possible for the component support 29 of the video card 120 according to the present invention to be provided with several connectors at its rear edge 22. In such a case all the terminals of those several connectors are coupled with respective terminals of the second edge connector 130.

It is usual for the video card, for the purpose of assembly in an ATX casing, to be provided with a metal bracket by which the rear edge of the video card can be secured to the rear wall of the casing, to thereby effect a firmer fixation of the video card. The video card 120 according to the present invention, if desired, can also be provided with such a fastening bracket, which must then be removed when mounting the card in an NLX casing.

Although such a bracket as mentioned is not essential to the proper functioning of the video card, such a bracket provides the advantage that the video card is mechanically secured in position if forces transverse to the sheet surface occur, as may happen during transport. As an alternative to such a fastening bracket, the present invention proposes to incorporate supporting points in the cover of the casing 1, which in assembled condition of the video card are disposed on opposite sides of the sheet, adjacent the upper edge thereof. That is to say, a first supporting point will cooperate with one main surface of the video card, and a second supporting point will cooperate with the other main surface of the video card. It is then desired that at the positions in question on the main surfaces of the video card, which positions are represented by way of example in FIG. 6 in dots and are designated by the reference numerals 121, no components be arranged. The position and dimensions of such video card portions to remain free from components could be laid down in the AGP standard.

In the foregoing, the present invention has been described in relation to a video card. It will be clear, however, that a comparable problem can occur with other function cards, where the same solution as proposed by the present invention is useful.

What is claimed is:

1. A function card comprising:
   a) a substantially rectangular, sheetlike component support having a lower edge and a rear edge;
   b) a first edge connector projecting from the lower edge of the component support and including terminals;
   c) a second edge connector projecting from the lower edge of the component support and including terminals; and,
   d) a third edge connector projecting from the rear edge of the component support and including terminals,
      wherein, the terminals of the second edge connector are directly coupled with the terminals of the third edge connector.

2. The function card of claim 1 wherein the second edge connector is arranged between the first edge connector and the rear edge of the component support.

3. The function card of claim 1 wherein the function card is a video card, and
   wherein the first edge connector and the third edge connector meet the AGP standard for ATX motherboards.

4. The method of claim 3 wherein the third edge connector is a sub-D connector.

5. The method of claim 1 wherein the third edge connector is a sub-D connector.

6. An NLX motherboard comprising:
   a) a plug-in connector for receiving a first edge connector of an AGP video card having
      i) a substantially rectangular, sheetlike component support having a lower edge and a rear edge,
      ii) a first edge connector projecting from the lower edge of the component support and including terminals,
      iii) a second edge connector projecting from the lower edge of the component support and including terminals, and
      iv) a third edge connector projecting from the rear edge of the component support and including terminals,
         wherein, the terminals of the second edge connector are directly coupled with the terminals of the third edge connector; and
   b) a rear edge,
      wherein a distance between the plug-in connector and the rear edge of the NLX motherboard is at least equal to A+B+D,
      wherein A is a length of the projection of the third edge connector from the rear edge of the component support,
      wherein B is a distance, prescribed in the AGP standard, between the plug-in connector and the rear edge of an ATX motherboard, and
      wherein D is a dimension of an I/O connector, as measured perpendicular to the rear edge of the NLX motherboard.

7. The NLX motherboard of claim 6 wherein the distance between the plug-in connector and the rear edge of the NLX motherboard is at least 108.88 mm.

* * * * *

UNITED STATES PATENT AND TRADEMARK OFFICE
CERTIFICATE OF CORRECTION

PATENT NO.    : 6,126,452
DATED         : October 3, 2000
INVENTOR(S)   : Robert-Jan Grotenhuis It is certified that error appears in the above-identified patent and that said Letters Patent is hereby corrected as shown below:

Title page,
Item [73], Assignee, change "Tulips" to -- Tulip --.

Signed and Sealed this

Twenty-fourth Day of May, 2005

JON W. DUDAS
*Director of the United States Patent and Trademark Office*